United States Patent
Xu et al.

(10) Patent No.: US 10,147,849 B2
(45) Date of Patent: Dec. 4, 2018

(54) MANUFACTURING METHOD OF FLIP-CHIP STRUCTURE OF GROUP III SEMICONDUCTOR LIGHT EMITTING DEVICE

(71) Applicant: XiangNeng HuaLei Optoelectronic Co., Ltd., Chenzhou (CN)

(72) Inventors: Shuncheng Xu, Chenzhou (CN); Zhiyong Liang, Chenzhou (CN); Bingjie Cai, Chenzhou (CN)

(73) Assignee: XIANGNENG HUALEI OPTOELECTRONIC CO., LTD, Chenzhou (CN)

( * ) Notice: Subject to any disclaimer, the term of this patent is extended or adjusted under 35 U.S.C. 154(b) by 0 days.

(21) Appl. No.: 15/318,362

(22) PCT Filed: May 5, 2016

(86) PCT No.: PCT/CN2016/081112
§ 371 (c)(1),
(2) Date: Dec. 13, 2016

(87) PCT Pub. No.: WO2016/177333
PCT Pub. Date: Nov. 10, 2016

(65) Prior Publication Data
US 2017/0133549 A1 May 11, 2017

(30) Foreign Application Priority Data

May 5, 2015 (CN) .......................... 2015 1 0223311
May 5, 2015 (CN) .......................... 2015 1 0224859

(51) Int. Cl.
*H01L 33/00* (2010.01)
*H01L 33/12* (2010.01)
(Continued)

(52) U.S. Cl.
CPC ............ *H01L 33/46* (2013.01); *H01L 33/007* (2013.01); *H01L 33/0075* (2013.01);
(Continued)

(58) Field of Classification Search
None
See application file for complete search history.

(56) References Cited

U.S. PATENT DOCUMENTS

| | | | | |
|---|---|---|---|---|
| 2011/0049546 A1* | 3/2011 | Heikman | ............... | H01L 33/387 257/98 |
| 2011/0156070 A1* | 6/2011 | Yoon | ..................... | H01L 33/385 257/98 |

(Continued)

FOREIGN PATENT DOCUMENTS

| | | |
|---|---|---|
| CN | 101872823 A | 10/2010 |
| CN | 104576867 A | 4/2015 |

(Continued)

OTHER PUBLICATIONS

International Search Report for PCT/CN2016/081112.
Written Opinion of the International Search Authority for PCT/CN2016/081112.

*Primary Examiner* — Erik T Peterson

(57) ABSTRACT

This disclosure refers to a manufacturing method of a flip-chip structure of III group semiconductor light emitting device. The manufacturing method includes steps of: growing a substrate, a buffer layer, an N type nitride semiconductor layer, an active layer and a P type nitride semiconductor layer sequentially from bottom to top to form an epitaxial structure, depositing a transparent conductive layer; defining an isolation groove with the yellow light etching process, depositing a first insulation layer structure, depositing a P type contact metal and N type contact metal, depositing a second insulation layer structure, depositing a flip-chip P type electrode and flip-chip N type electrode, then (Continued)

removing the photo resist by using of the stripping process to get a wafer; thinning, dicing, separating, measuring and sorting the wafer. In this disclosure, structure of the first insulation layer structure which is formed by the Prague reflective layer, the metal layer and the multilayer of oxide insulation, acts as a reflector structure and an insulation layer to replace the flip-chip reflector structure design and the first insulation layer, so that a metal protective layer can be omitted.

14 Claims, 7 Drawing Sheets

(51) Int. Cl.
| | |
|---|---|
| *H01L 33/46* | (2010.01) |
| *H01L 33/20* | (2010.01) |
| *H01L 33/62* | (2010.01) |
| *H01L 33/38* | (2010.01) |
| *H01L 33/42* | (2010.01) |
| *H01L 33/10* | (2010.01) |
| *H01L 27/15* | (2006.01) |

(52) U.S. Cl.
CPC .............. *H01L 33/12* (2013.01); *H01L 33/20* (2013.01); *H01L 33/38* (2013.01); *H01L 33/42* (2013.01); *H01L 33/62* (2013.01); *H01L 27/153* (2013.01); *H01L 33/10* (2013.01); *H01L 33/382* (2013.01); *H01L 2933/0016* (2013.01); *H01L 2933/0025* (2013.01)

(56) References Cited

U.S. PATENT DOCUMENTS

| | | | |
|---|---|---|---|
| 2012/0043567 A1* | 2/2012 | Yan | H01L 33/46 257/98 |
| 2012/0049219 A1* | 3/2012 | Kamiya | H01L 33/382 257/98 |
| 2012/0049236 A1* | 3/2012 | Kamiya | H01L 33/20 257/99 |
| 2012/0074441 A1* | 3/2012 | Seo | H01L 27/153 257/91 |
| 2013/0105845 A1* | 5/2013 | Kim | H01L 27/156 257/98 |
| 2014/0124730 A1* | 5/2014 | Choi | H01L 33/10 257/13 |
| 2014/0159071 A1* | 6/2014 | Choi | H01L 27/15 257/88 |
| 2014/0252390 A1* | 9/2014 | Yoon | H01L 33/405 257/98 |
| 2015/0021639 A1* | 1/2015 | Huang | H01L 33/405 257/98 |
| 2015/0155426 A1* | 6/2015 | Jeon | H01L 33/46 438/29 |
| 2015/0200230 A1* | 7/2015 | Jang | H01L 27/156 257/91 |
| 2015/0364643 A1* | 12/2015 | Sumitomo | H01L 33/0079 438/29 |
| 2016/0064617 A1* | 3/2016 | Yang | H01L 33/46 257/98 |

FOREIGN PATENT DOCUMENTS

| | | |
|---|---|---|
| CN | 104821351 A | 8/2015 |
| CN | 104952995 A | 9/2015 |
| JP | 3439161 B2 | 8/2003 |

* cited by examiner

MANUFACTURING METHOD OF FLIP-CHIP STRUCTURE OF GROUP III SEMICONDUCTOR LIGHT EMITTING DEVICE

FIELD OF THE INVENTION

The disclosure refers to semiconductor illumination, and more particularly to a manufacturing method of a flip-chip structure of a group III semiconductor light emitting device.

DESCRIPTION OF THE RELATED ART

Traditionally, a light emitting diode has a structure, in which a transparent conductive layer generally uses highly transparent materials such as ITO and AZO, and the electrodes use materials such as Cr, Pt or Au. However, in a flip-chip structure, light activated by the active layer emits from the other base of the electrode, thus the requirement of a p-type electrode is changed. A high reflective material, which is used to cover the whole p-type nitride semiconductor layer, is used as a reflector. One way to fulfill the requirement is applying a highly transparent electrode with a highly reflective metal 6, such as ITO and Ag, respectively. Another way is applying a highly reflective metal 6, such as Ag and Al, and using as an ohmic contact and reflector. No matter which way is selected, a metal protective layer 7 (guard metal) must be used on the back of the highly reflective material to avoid instability. The metal protection layer 7 is formed by the steps of forming a titanium layer and a tungsten layer in sequence or a titanium tungsten alloy layer, etching a plurality of holes (vias), as shown in the structure diagram in FIG. 1, covering an entire surface of a first insulation layer 8, opening holes to access an n-type nitride semiconductor layer and metal protection layer, re-plating a p-type contact metal 9 and an n-type contact metal 10, covering the second insulation layer, opening holes to access the p-type contact metal 9 and the n-type contact metal 10, and plating the flip-chip structure p-type electrode and n-type electrode. Due to the high accuracy of the etching holes, a complex process is required, and the production cost becomes higher.

SUMMARY OF THE INVENTION

In order to solve the defects existing in the prior art, the disclosure aims to provide a manufacturing method of a flip-chip structure of a group III semiconductor light emitting device, which includes steps of:

providing a substrate and forming a buffer layer, an n-type nitride semiconductor layer, an active layer and a p-type nitride semiconductor layer on the substrate sequentially from a bottom to a top to form an epitaxial structure, wherein the top surface of the epitaxial structure is the top surface of the p-type nitride semiconductor layer;

depositing a transparent conductive layer on the top surface of the p-type nitride semiconductor, defining a pattern of a linear convex mesa using an etching process to etch the transparent conductive layer, the p-type nitride semiconductor layer and the active layer, thereby exposing the n-type nitride semiconductor layer; and shrinking the transparent conductive layer with a solution; and obtaining the linear convex mesa whose top surface has the transparent conductive layer, wherein the linear convex mesa comprises a first top surface, a side surface and a second top surface, the first top surface and the second top surface being individually connected with the side surface to form an L-shaped structure, the first top surface of the linear convex mesa being the top surface of the p-type nitride semiconductor layer, and the second top surface of the linear convex mesa being the top surface of the n-type nitride semiconductor layer; in this step, the transparent conductive layer and the linear convex mesa may not be formed in the same etching step, but instead forming the transparent conductive layer first and then forming the linear convex mesa, or forming the linear convex mesa first and then forming the transparent conductive layer;

defining an isolation groove by etching the n-type nitride semiconductor layer and the buffer layer to expose the substrate; or the isolation groove may not be arranged in the flip-chip structure of the group III semiconductor light emitting device;

depositing a first insulation layer structure, which is formed by a Bragg reflective layer, a metal layer and a multilayer of oxide insulation; wherein the Bragg reflective layer is deposited at first, the metal layer is deposited, a pattern on the metal layer is defined, the multilayer of oxide insulation is deposited, a connection pattern between a p-type contact metal and the transparent conductive layer and a contact pattern between an n-type contact metal and the second top surface of the linear convex mesa by an etching process are defined, and then a connecting pattern between the multilayer of the oxide insulation and the Bragg reflective layer is continuously etched before obtaining the first insulation layer structure;

defining a pattern of the p-type contact metal and a pattern of the n-type contact metal by an etching process, wherein the p-type contact metal and the n-type contact metal is deposited in the mean time, before obtaining the p-type contact metal and the n-type contact metal, wherein a bottom side of the p-type contact metal is located on the surface of the transparent conductive layer and the first insulation layer structure, and a bottom side of the n-type contact metal is located on the second top surface of the linear convex mesa and the surface of the first insulation layer structure;

depositing the second insulation layer structure, wherein a pattern is defined by an etching process, and the pattern is used for accessing the p-type contact metal and the n-type contact metal with an opening, and then an opening pattern of the second insulation layer structure is etched;

defining a pattern of a flip-chip p-type electrode and a flip-chip n-type electrode, wherein the flip-chip p-type electrode and the flip-chip n-type electrode is deposited to obtain a wafer; thinning, dicing, separating, measuring and sorting the wafer.

Preferably, the first insulation layer structure is located on the first top surface, the side surface, the second top surface, the transparent conductive layer and the optional isolation groove.

Preferably, the structure of the Bragg reflective layer comprises silicon dioxide and titanium dioxide, or silicon dioxide and tantalic oxide, or silicon dioxide and niobium oxide.

Preferably, the thickness of the silicon dioxide is in a range of 30-1000 nm, the thickness of the titanium dioxide is in a range of 10-200 nm, the thickness of the tantalic oxide is in a range of 10-200 nm, and the thickness of the niobium oxide is in a range of 10-200 nm.

Preferably, the Bragg reflective layer is silicon dioxide/titanium dioxide/silicon dioxide/titanium dioxide/silicon dioxide, or silicon dioxide/tantalic oxide/silicon dioxide/tantalic oxide/silicon dioxide, or silicon dioxide/niobium oxide/silicon dioxide/niobium oxide/silicon dioxide.

Preferably, the first insulation layer structure is formed by the Bragg reflective layer, the metal layer, the Bragg reflective layer, the metal layer and the multilayer of the oxide insulation, a bottom side of the metal layer is located on the top surface of the Bragg reflective layer of the first insulation layer structure, and/or is located in the multilayer of the oxide insulation layer of the first insulation layer structure.

Preferably, the metal layer material comprises at least one of silver, aluminum, silver indium, platinum, nickel and titanium, wherein a thickness of the silver, the aluminum, the silver indium and the platinum is respectively in a range of 50-500 nm, and a thickness of the nickel and the titanium is respectively in a range of 0.3-30 nm.

Preferably, the multilayer of the oxide insulation layer is formed by at least two of aluminum oxide, silicon dioxide, titanium dioxide, tantalic oxide, niobium oxide, silicon oxide and silicon nitride, a thickness of each layer of the multilayer of the oxide insulation is in a range of 30-200 nm.

Preferably, the p-type contact metal comprises a p-type linear electrode and the p-type connection metal; the bottom side of the p-type linear electrode is located on the surface of the first insulation layer structure and the transparent conductive layer; the bottom side of the p-type connection metal is located on the surface of first insulation layer structure; and the n-type contact metal comprises an n-type linear electrode and the n-type connection metal, a bottom side of the n-type linear electrode is located on the first insulation layer structure and the second top surface, a bottom side of the n-type connection metal is disposed on the surface of the first insulation layer structure.

Preferably, the structure of the p-type contact metal is a multilayer of metal layer, the structure of the n-type contact metal is a multilayer of metal layer, and both the p-type contact metal and the n-type contact metal sequentially comprise a first Ni layer, an Al layer, a second Ni layer, an Au layer and a third Ni layer from an inner to an outer side, or sequentially comprise a Ti layer, an Al layer, the second Ni layer, an Au layer and the third Ni layer from an inner to an outer side, or sequentially comprise the Ti layer, the Al layer and the third Ni layer from an inner to an outer side, or sequentially comprise the first Ni layer, the Al layer, the second Ni layer, a Pt layer, the Au layer and the third layer Ni from an inner to an outer side, or sequentially comprise an Cr layer, the Pt layer, the Au layer and the third Ni layer from an inner to an outer side, or sequentially comprise the first Ni layer, the Al layer and the third Ni layer, or sequentially comprise an Rh layer, wherein a thickness of the Rh layer is in a range of 50-3000 nm, a thickness of the first Ni layer is in a range of 0.3-300 nm, a thickness of the Al layer is in a range of 50-300 nm, a thickness of the second Ni layer is in a range of 10-300 nm, a thickness of the Pt layer is in a range of 10-300 nm, a thickness of the Au layer is in a range of 10-3000 nm, and a thickness of the third Ni layer is in a range of 0.3-300 nm.

Preferably, the second insulation layer structure is a multilayer of the oxide insulation, the multilayer of the oxide insulation is formed by at least two of aluminum oxide, silicon dioxide, titanium dioxide, tantalic oxide, niobium oxide, silicon oxide and silicon nitride, a thickness of each layer of the multilayer of the oxide insulation is in a range of 30-2000 nm.

Preferably, the bottom side of the flip-chip p-type electrode is deposited on the surface of the p-type contact metal and the second insulation layer structure, the bottom side of the flip-chip n-type electrode is disposed on the surface of the n-type contact metal and the second insulation layer structure.

Preferably, the flip-chip p-type electrode and the flip-chip n-type electrode has the same structure, and both sequentially comprise a Ti layer and a second Ni layer and an Au layer from an inner to an outer side, or sequentially comprise a middle Cr layer, a Pt layer, an Au layer, a second Ni layer, a Pt layer, a second Ni layer and an AuSn layer from an inner to an outer side, or sequentially comprise a first Ni layer and an Al layer, the second Ni layer and the Au layer from an inner to an outer side, or sequentially comprise the middle Cr layer, the Pt layer and the Au layer from an inner to an outer side, or sequentially comprise the first Ni layer, the Al layer, the middle Cr layer and the second Ni layer and the Au layer from an inner to an outer side, or sequentially comprise the first Ni layer, the Al layer, the second Ni layer, the Pt layer and the Au layer from an inner to an outer side, wherein a thickness of the first Ni layer is in a range of 0.4-3 nm, a thickness of the second Ni layer is in a range of 10-300 nm, a thickness of the Ti layer is in a range of 10-300 nm, a thickness of the Al layer is in a range of 50-300 nm, a thickness of the Au layer is in a range of 20-3000 nm, a thickness of the middle Cr layer is in a range of 10-300 nm, a thickness of the Pt layer is in a range of 10-300 nm, and a thickness of the AuSn layer is in a range of 1000-5000 nm.

The manufacturing method of a flip-chip structure of a group III semiconductor light emitting device in this disclosure, has the following advantages.

The disclosure is provided for using the linear convex mesa to replace a plurality of holes (vias) in the prior art.

In this disclosure, the first insulation layer structure, which is formed by the Bragg reflective layer, the metal layer and the multilayer of oxide insulation, acts as a reflector structure and an insulation layer to replace the flip-chip reflector structure design and the first insulation layer, and a metal protective layer can be omitted. Furthermore, no reflector structure is provided on the side wall of the traditional flip-chip linear convex mesa without a reflector structure. The reflector structure can be located on the side wall of the linear convex mesa in the disclosure, and an isolation groove can be arranged as well. The isolation groove is also arranged with the reflector structure.

In this disclosure, the transparent conductive layer and the line convex mesa pattern can be made at the same time not only simplifies one process, but also solves the alignment defects between the transparent conductive layer and the linear convex mesa pattern.

In this disclosure, the first insulation layer structure is formed by a Bragg reflective layer, the metal layer and the multilayer of oxide insulation, and then plated with a p-type contact metal and an n-type contact metal. Thus, the photoelectric properties of the flip-chip structure can be measured out in this step.

In this disclosure, the transparent conductive layer and the first insulation layer structure of the new structure is arranged sequentially on the first surface of the linear convex mesa. Namely, in this disclosure, a conductive metal layer with a high reflectivity and ITO or p-type nitride semiconductor layer is not set in direct contact on the p-type nitride semiconductor layer, but the non-conductive first conductive insulation layer structure 8 (specifically Bragg reflector) and the transparent conductive layer which is located on top of the p-type nitride semiconductor layer is in direct contact. Thus, the structure of a flip-chip LED chip in this disclosure is significantly different from the flip-chip structure shown in FIG. 1.

When the first insulation layer structure of the disclosure is formed by a Bragg reflective layer, the metal layer and the multilayer of oxide insulation, the first insulation layer is provided with a metal interlayer structure, and in particular the metal layer is located between the Bragg reflective layer and the multilayer oxide insulation layer, or the metal layer is sandwiched inside the internal layer of the multilayer of oxide insulation. Therefore, in order to obtain a flip-chip LED chip, this disclosure provides a novel insulation layer structure.

The implementation of the disclosure of any product will not necessarily require all of the mentioned technical results above to be achieved at the same time.

BRIEF DESCRIPTION OF THE ATTACHED DRAWINGS

The attached drawings described here which is provided for further understanding of this disclosure, constitute a part of the disclosure, and the illustrative embodiment is used as one interpretation of this disclosure.

Figure 1:
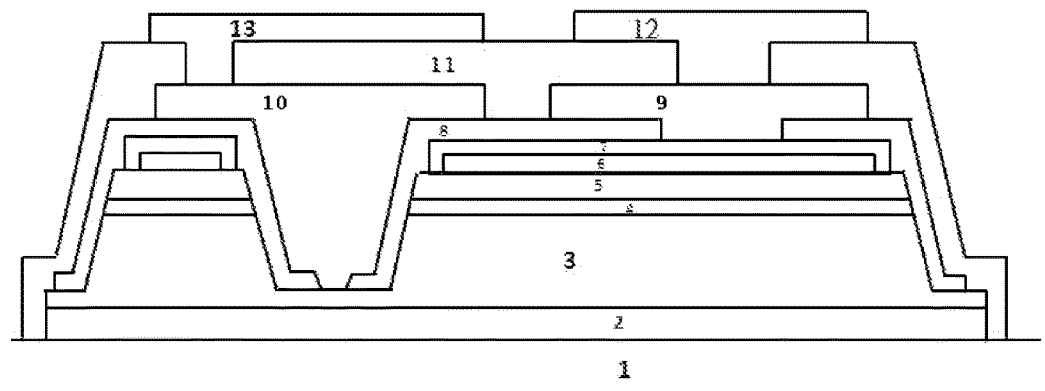
FIG. 1 is a schematic for the flip-chip structure of a group III nitride semiconductor light emitting device in prior art.

In the drawings:
1—Substrate
2—Buffer layer
3—n-type nitride semiconductor layer
4—Active layer
5—p-type nitride semiconductor layer
6—Metal layer with high reflectivity
7—metal protection layer
8-1—the first insulation layer
801—single-layer oxide insulation layer
802—Metal layer
803—Bragg reflective layer
9—p-type contact metal
10—n-type contact metal
11-1 the second insulation layer
13—Flip-chip n-type electrode
14—Transparent conductive layer
15—p-type linear electrode
17—n-type linear electrode
19—Linear convex mesa
19-1—The first top surface
19-2—Side surface
19-3—The second top surface
20—Isolation groove
21—p-type contact metal
22—n-type contact metal

DETAILED DESCRIPTION OF THE PREFERRED EMBODIMENT

If certain words are used to refer to a specific component in the specification and claims, those skilled in the field should understand that hardware manufacturers may use different terms to name the same component. This specification and the claim does not differentiate each other in the way of the name, but uses the functional differences of the component as the criteria. As mentioned in the whole specification and claims, the word "contains" is an open language, it should be interpreted as "including but not limited to". The word "Roughly" refers to the range of error acceptance, the skilled in the field should solve the technical defects within a certain a range of error and achieve the basic technical effect. In addition, the word "coupling" includes any direct and indirect means of electrical coupling. Therefore, if the description "a first coupling device coupled to a second device" is used, it means the first device can be directly connected to the second electrical coupled device, or by indirect means it is electrically coupled to the second device by the other device or coupling. The following instructions are described as preferred embodiment for the implementation of this disclosure. However, it is the general principle that the purpose of description of this disclosure is not limited to the scope of disclosure. The scope of protection of this disclosure shall be subject to the requirements defined in the appended claims.

Further details of the disclosure is provided according to the drawings, but it is not regarded as a restriction on the disclosure.

Embodiment 1

This disclosure provides a manufacturing method of a flip-chip structure of group III semiconductor light emitting device, details are shown in FIG. 2A through FIG. 2G.

The manufacturing method includes the following steps.

Figure 2A:
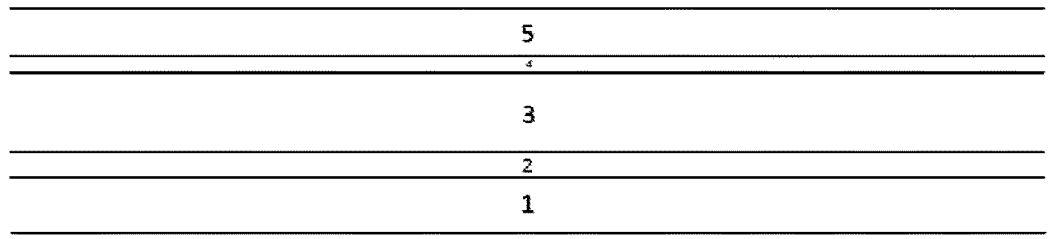
FIG. 2A to FIG. 2G are schematics of making the flip-chip LED chip of which the first insulation layer structure is formed by the Bragg reflective layer, the metal layer and the multilayer of oxide insulation.

A first step, as shown in FIG. 2A, includes the steps of: providing the substrate 1 and growing the buffer layer 2, n-type nitride semiconductor 3, active layer 4 and the p-type nitride semiconductor on the substrate 1 sequentially from a bottom to a top to form the epitaxial structure, wherein the top surface of the epitaxial structure is the top surface of the p-type nitride semiconductor layer 5.

Figure 2B:
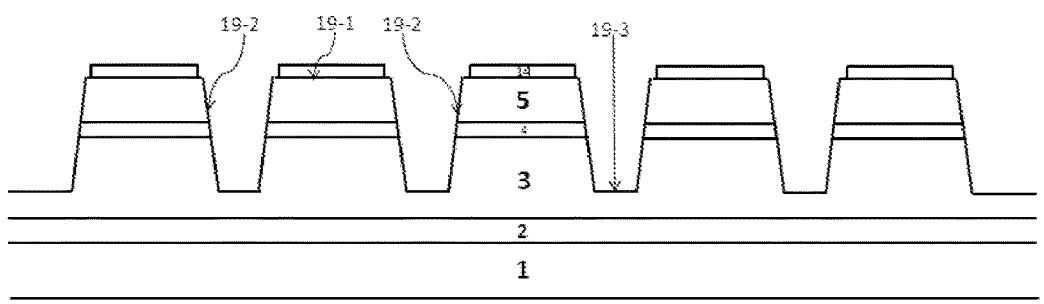

A second step, as shown in FIG. 2B, includes the steps of: depositing a transparent conductive layer 14 on the top surface of a p-type nitride semiconductor 5, defining a pattern of a linear convex mesa by etching the transparent conductive layer 14 and the p-type nitride semiconductor layer 5 and active layer 4, exposing the n-type nitride semiconductor layer 3, and then shrinking the transparent conductive layer 14 with a solution to get the linear convex mesa 19, whose top surface has the transparent conductive layer 14 (the transparent conductive layer 14 and the convex mesa 19 can be made individually on this step).

In this disclosure, the transparent conductive layer 14 and the linear convex mesa 19 may be formed at the same time, that is, the transparent conductive layer 14 is deposited on the entire surface of the p-type nitride semiconductor 5, and the transparent conductive layer 14 and the linear convex mesa 19 are formed in one etching step. The transparent conductive layer 14 and the linear convex mesa 19 may be formed individually in one of two ways. The first is to form the transparent conductive layer 14 first, and then the linear convex mesa 19. More specifically, the transparent conductive layer 14 is formed on the p-type nitride semiconductor 5, and then the shape of the linear convex mesa 19 is defined and etched to obtain the linear convex mesa 19. The other way is to make the linear convex mesa 19 first, and then the transparent conductive layer 14. That is, the convex shape is first defined and etched to get the linear convex mesa 19, and the transparent conductive layer 14 is formed on the first top surface 19-1 of the linear convex mesa.

Figure 2C:
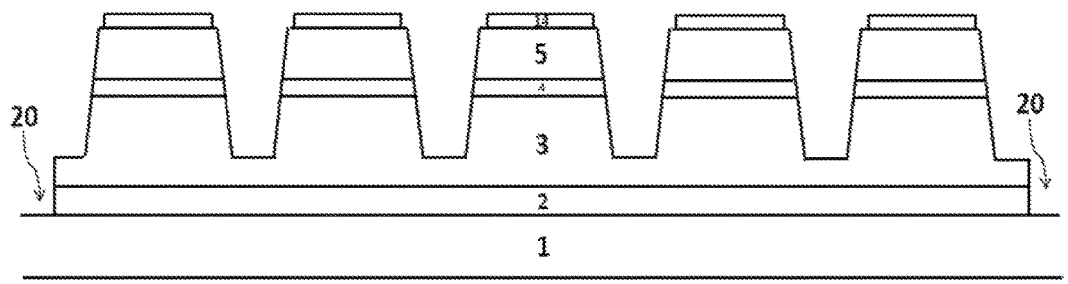

A third step, as shown in FIG. 2C, includes the steps of: defining a pattern of the isolation groove 20 and etching the n-type semiconductor layer 3 and buffer layer 2 to expose the substrate 1.

In this disclosure, the isolation groove 20 of the LED chip can have any one of the following conditions:

no isolation groove;

only contains the second insulation layer 11-1 above the isolation groove;

a first insulation layer 8-1 and a second insulation layer 11-1 exists above the isolation groove; and the isolation groove above only contains the first insulation layer 8-1.

As mentioned above, the LED chip may or may not be provided with the isolation groove 20, and the isolation groove 20 is generally formed before the second insulation layer structure is formed. More specifically, the isolation groove is formed before the first insulation layer structure 8-1 is formed, and the isolation groove comprises a first insulation layer 8-1 and a second insulation layer 11-1, or it only comprises the first insulation layer 8-1. The isolation groove can also be formed in any of the steps before the second insulation layer 11-1 or after the first insulation layer structure 8-1, so that the isolation groove only comprises the second insulation layer 11-1.

Figure 2D:
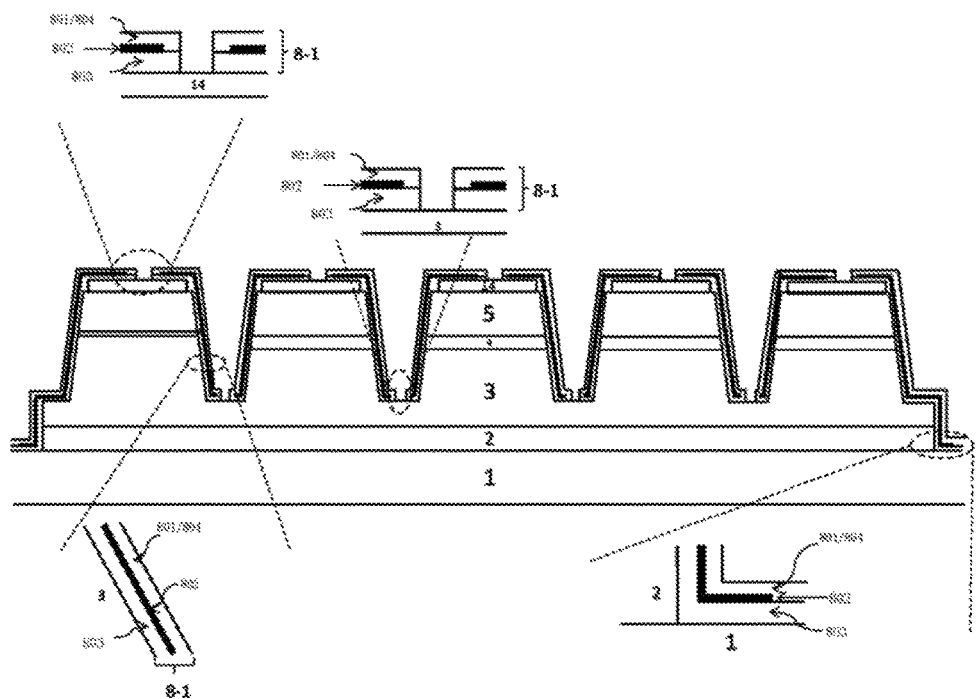

A fourth step, as shown in FIG. 2D, includes forming the first insulation layer structure 8-1 with a Bragg reflective layer, a metal layer and a multilayer of oxide insulation. In this step, the Bragg reflective layer is deposited at first, a metal layer is deposited, a pattern on the metal layer is defined, the multilayer of oxide insulation is deposited, a connection pattern between a p-type contact metal and the transparent conductive layer of an n-type contact metal 10 and the second top surface 19-3 of the linear convex mesa are defined by an etching process, and then a connecting pattern between the multilayer of the oxide insulation and the Bragg reflective layer is continuously etched before obtaining the first insulation layer structure 8-1. The connection pattern can be dotted, linear or span a flat surface.

As shown in the drawings, the first insulation layer structure 8-1 is formed by the Bragg reflective layer, the metal layer and the single layer of oxide insulation or multilayer of oxide insulation. However, the first insulation layer structure 8-1, which is formed by the Bragg reflective layer 803, the metal layer 802 and the multilayer of oxide insulation 804, has a better effect than that formed by the Bragg reflective layer 803, the metal layer 802 and the single layer oxide insulation 801. Hence, only the optimized scheme is protected in this disclosure.

Figure 2E:
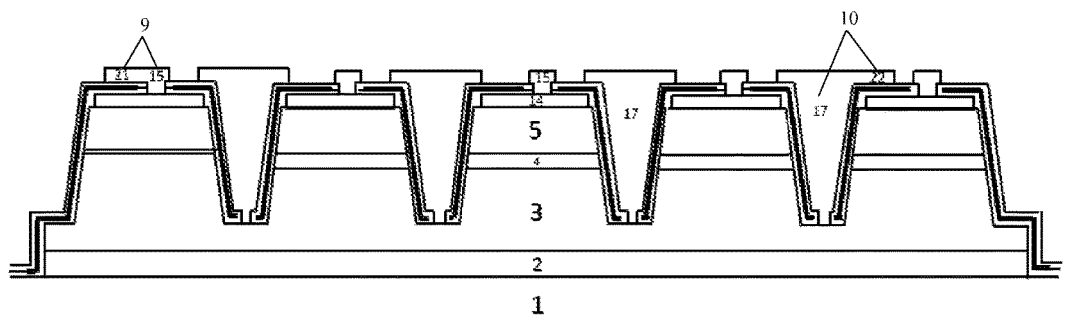

A fifth step, as shown in FIG. 2E, includes the steps of: defining a pattern of the p-type contact metal 9 and a pattern of the n-type contact metal 10 by an etching process, and depositing the p-type contact metal 9 and the n-type contact metal 10 in the mean time, before obtaining the p-type contact metal 9 and the n-type contact metal 10.

As shown in FIG. 2E, the p-type contact metal and the n-type contact metal comprises a p-type linear electrode 15, an n-type linear electrode 17, a p-type connection metal 21 and an n-type connection metal 22. The bottom end of the p-type linear electrode 15 is located on the surface of the first insulation layer structure 8-1 and a transparent conductive layer 14, the bottom end of the n-type linear electrode 17 is located on the surface of the first insulation layer structure 8-1 and the second top surface of the linear convex mesa 19-3, and the bottom end of the n-type connection metal 22 is located on the surface of the first insulation layer structure 8-1.

In fact, the structure of the p-type contact metal 9 and the n-type contact metal 10 can be selected from the following three types below.

(1) The p-type contact metal 9 comprises the metal on the entire surface, the bottom end of the entire surface of the metal is located on the surface of the first insulation layer structure 8-1 and the transparent conductive layer 14, and the exposed transparent conductive layer 14 is completely covered by the lower end of the metal of the entire surface.

The n-type contact metal 10 comprises the metal on the entire surface, the bottom end of the entire surface of the metal is located on the surface of the first insulation layer structure 8-1 and the second top surface 19-3 of the linear convex mesa, and the exposed top surface 19-3 is completely covered by the metal of the entire surface;

(2) The p-type contact metal 9 comprises the p-type linear electrode 15 and a p-type pad. The bottom end of the p-type pad is located on the surface of the first insulation layer 8-1, and the bottom end of the p-type linear electrode 15 is located on the transparent conductive layer 6 or on the surface of the first insulation layer structure 8-1 and the transparent conductive layer 6.

The n-type contact metal 10 comprises the n-type linear electrode 17 and a normal n-type pad, the bottom end of the normal n-type pad is located on the surface of the first insulation layer 8-1, and the bottom end of the n-type linear electrode 17 is located on the second top surface 19-3 of the linear convex mesa or on the second top surface of the first insulation layer structure 8-1 and the linear convex mesa.

(3) The p-type contact metal 9 comprises the p-type linear electrode 15 and the P connection metal 21, the bottom end of the p-type linear electrode 15 is located on the transparent conductive layer 6 or on the surface of the first insulation layer 8-1 and transparent conductive layer 6, the bottom end of the p-type connection metal 21 is located on the surface of the first insulation layer structure 8-1.

The n-type contact metal 10 comprises the n-type linear electrode 17 and the n-type connection metal 22, the bottom end of the n-type linear electrode 17 is located on the second top surface 19-3 of the linear convex mesa or on the first insulation layer 8-1 and the second top surface 19-3 of the first insulation layer, and the bottom end of the n-type connection metal 22 is located on the surface of the first insulation layer structure 8-1.

The main difference between the pad of the scheme (2) and the connection metal of scheme (3) is that both the size and the shape of the pad are fixed, while both the size and the shape of the metal connection are not restricted.

In addition, no matter which of the above types (1) to (3) the contact metal belongs to, the patterns of the p-type contact metal and the n-type contact metal are defined, the p-type contact metal and the n-type contact metal are deposited by using electron beam evaporation before obtaining the p-type contact metal and the n-type contact metal.

Figure 2F:
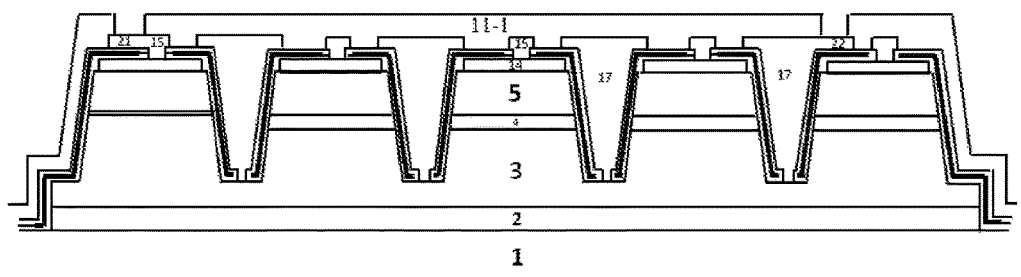

The sixth step, as shown in FIG. 2F, includes depositing the second insulation layer structure 11-1. A pattern is defined for accessing the p-type contact metal 9 and the n-type contact metal 10 with an opening, and then an opening pattern of the second insulation layer structure 11-1 is etched. The pattern of opening and access can be linear, dotted or flat shaped.

The second insulation layer is a single layer oxide insulation or a multilayer of oxide insulation. No matter which of the three structures of the p-type contact metal 9 and the n-type contact metal 10 belongs to, the second insulation layer structure 11-1 can be a single layer or a multilayer of oxide insulation.

Figure 2G:
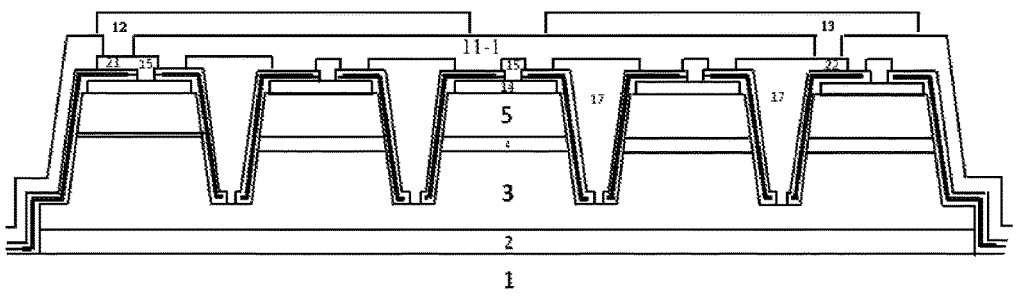

A seventh step, as shown as FIG. 2G, includes the steps of: defining a pattern of a flip-chip p-type electrode 12 and a flip-chip n-type electrode 13, wherein the flip-chip p-type electrode 13 and the flip-chip n-type electrode 13 is deposited.

An eighth step includes the steps of: thinning, dicing, separating, measuring and sorting the wafer. This step can be obtained through the production process of the prior art.

By the use of the method above, the flip-chip structure of the group III semiconductor light emitting device is attained. The flip-chip structure includes the substrate 1, a buffer layer 2, the n-type nitride semiconductor layer 3, the active layer 4, the p-type nitride semiconductor layer 5, the first insulation layer structure 8-1, the p-type contact metal 9, the n-type contact metal 10, the second insulation layer structure 11-1, the flip-chip p-type electrode 12, the flip-chip n-type electrode 13 and the transparent conductive layer 14.

The substrate 1, the buffer layer 2, the n-type nitride semiconductor layer 3, the active layer 4, and the P nitride semiconductor layer 5 are formed into a nitride semiconductor structure with a linear convex mesa 19.

The linear convex mesa 19 comprises the first top surface 19-1 of linear convex mesa, the side surface 19-2 and the second top surface 19-3 of the linear convex mesa. An L shape is formed by the side surface 19-2 and the second top surface 19-3 located on the both ends of the first top surface 19-1.

The first top surface 19-1 of the convex mesa is the top surface of the p-type nitride semiconductor layer 5, which becomes a top surface of the linear convex mesa. The second top surface 19-3 of the linear convex mesa is the top surface of the n-type nitride semiconductor layer, which becomes a bottom surface of the linear convex mesa. The side surface 19-2 is connected between the first top surface 19-1 and the second top surface 19-3, and the convex mesa comprises these three surfaces.

The etched area of the linear convex mesa 19 is a single line or has multiple lines, that is, the linear convex mesa 19 is referred to the convex mesa formed by the etching of planar cross-cutting.

The transparent conductive layer 14 is disposed on the first top surface 19-1 of the linear convex mesa.

The material of the transparent conductive layer 14 can be at least one of Indium tin oxide (ITO), Cadmium tin oxide, Zinc oxide, Indium oxide, Tin oxide, Copper (II) Aluminum oxide, Copper (II) Gallium (III) oxide and Strontium Copper oxide.

The first insulation layer structure 8-1 is located on the first top surface 19-1, the side surface 19-2, the second top surface 19-3 and the transparent conductive layer 14 of the linear convex mesa.

Preferably, the first insulation layer structure 8-1 is formed by the Bragg reflective layer, the metal layer and the multilayer of oxide insulation.

The Bragg reflective layer structure comprises silicon dioxide and titanium dioxide, silicon dioxide and tantalic oxide, or silicon dioxide and niobium oxide. In the Bragg reflective layer, the thickness of the silicon dioxide is in a range of 30-1000 nm, the thickness of the titanium dioxide is in a range of 10-200 nm, the thickness of the tantalic oxide is in a range of 10-200 nm, and the thickness of the niobium oxide is in a range of 10-200 nm.

Preferably, the Bragg reflective layer is silicon dioxide/ titanium dioxide/silicon dioxide/titanium dioxide/silicon dioxide, or silicon dioxide/tantalic oxide/silicon dioxide/ tantalic oxide/silicon dioxide, or silicon dioxide/niobium oxide/silicon dioxide/niobium oxide/silicon dioxide.

Preferably, the first insulation layer structure 8-1 includes the multilayer of the oxide insulation, the metal layer, and the Bragg reflective layer. The multilayer of the oxide insulation layer of the first insulation layer structure 8-1 is located on the metal layer and the metal layer is located on the top surface of the Bragg reflective layer of the first insulation layer structure 8-1. No direct contact is allowed by such a setting between the metal layer and the transparent conductive layer 14, hence insulation is guaranteed on the first insulation layer structure 8-1 of the metal layer 802.

The metal layer material comprises at least one of silver, aluminum, silver indium, platinum, nickel and titanium, wherein a thickness of the silver, the aluminum, the silver indium and the platinum is respectively in a range of 50-500 nm, and a thickness of the nickel and the titanium is respectively in a range of 0.3-30 nm.

The multilayer of the oxide insulation layer is formed by at least two of aluminum oxide, silicon dioxide, titanium dioxide, tantalic oxide, niobium oxide, silicon oxide and silicon nitride.

A thickness of each layer of the multilayer of the oxide insulation is in a range of 30-200 nm.

The bottom end of the p-type linear electrode is located on the surface 8-1 of the first insulation layer structure and the transparent conductive layer 14.

The bottom end of the n-type linear electrode 17 is located on the surface of the first insulation layer structure 8-1 and the second surface 19-3 of linear convex mesa.

The p-type contact metal 9 comprises a p-type linear electrode 15 and the p-type connection metal 21. The bottom end of the p-type linear electrode 15 is located on the surface of the first insulation layer structure 18-1 and the transparent conductive layer 14, and the bottom end of the p-type connection metal 21 is located on the surface of the first insulation layer structure 8-1.

The n-type contact metal 10 comprises an n-type linear electrode 17 and the n-type connection metal 22. The bottom end of the n-type linear electrode 17 is located on the first insulation layer structure 8-1 and the second top surface 19-3 of the linear convex mesa, the bottom end of the n-type connection metal is located on the surface of the first insulation layer structure 8-1.

The structure of the p-type contact metal 9 and the n-type contact metal 10 is a single metal layer or a multilayer metal layer.

The p-type contact metal 9 and the n-type contact metal 10 have the same structure.

The p-type contact metal 9 and the n-type contact metal 10 sequentially comprise a first Ni layer, an Al layer, a second Ni layer, an Au layer and a third Ni layer from an inner to an outer side, or sequentially comprise a Ti layer, an Al layer, the second Ni layer, an Au layer and the third Ni layer from an inner to an outer side, or sequentially comprise the Ti layer, the Al layer and the third Ni layer from an inner to an outer side, or sequentially comprise the first Ni layer, the Al layer, the second Ni layer, a Pt layer, the Au layer and the third layer Ni from an inner to an outer side, or sequentially comprise an Cr layer, the Pt layer, the Au layer and the third Ni layer, or sequentially comprise the first Ni layer, the Al layer and the third Ni layer, or sequentially comprise an Rh layer, wherein a thickness of the Rh layer is in a range of 50-3000 nm, a thickness of the first Ni layer is in a range of 0.3-300 nm, a thickness of the Al layer is in a range of 50-300 nm, a thickness of the second Ni layer is in a range of 10-300 nm, a thickness of the Pt layer is in a range of 10-300 nm, a thickness of the Au layer is in a range of 10-3000 nm, a thickness of the third Ni layer is in a range of 0.3-300 nm.

The top surface of the first insulation layer 8-1 and the p-type contact metal 9 and n-type contact metal 10 comprise the second insulation layer 11-1.

The second insulation layer 11-1 is a multilayer oxide insulation,

The multilayer of the oxide insulation is formed by at least two of aluminum oxide, silicon dioxide, titanium dioxide, tantalic oxide, niobium oxide, silicon oxide and silicon nitride.

A thickness of each layer of the multilayer oxide insulation layer is 30-2000 nm.

The bottom side of the flip-chip p-type electrode 12 is disposed on the surface of the p-type contact metal 9 and the second insulation layer 11-1.

The bottom side of the flip-chip n-type electrode is disposed on the surface of the n-type contact metal and the second insulation layer structure 11-1.

The flip-chip p-type electrode 12 and the flip-chip n-type electrode 13 have the same structure. The flip-chip p-type electrode 12 and the flip-chip n-type electrode 13 sequentially comprises a Ti layer and a second Ni layer and an Au layer from an inner to an outer side, or sequentially comprise a middle Cr layer, a Pt layer, an Au layer, a second Ni layer a Pt layer, a second Ni layer and an AuSn layer from an inner to an outer side, or sequentially comprise a first Ni layer and an Al layer, the second Ni layer and the Au layer from an inner to an outer side, or sequentially comprise the middle Cr layer, the Pt layer and the Au layer from an inner to an outer side, or sequentially comprise the first Ni layer, the Al layer, the middle Cr layer and the second Ni layer and the Au layer from an inner to an outer side, or sequentially comprise the first Ni layer, the Al layer, the second Ni layer, the Pt layer and the Au layer from an inner to an outer side, wherein a thickness of the first Ni layer is in a range of 0.4-3 nm, a thickness of the second Ni layer is in a range of 10-300 nm, a thickness of the Ti layer is in a range of 10-300 nm, a thickness of the Al layer is in a range of 50-300 nm, a thickness of the Au layer is in a range of 20-3000 nm, a thickness of the middle Cr layer is in a range of 10-300 nm, a thickness of the Pt layer is in a range of 10-300 nm, and a thickness of the AuSn layer is in a range of 1000-5000 nm.

Embodiment 2

The novel structure of this disclosure is provided for using the linear convex mesa technique to replace a plurality of holes (vias).

Figure 3A:
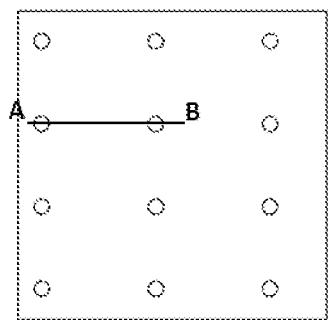
FIG. 3A and FIG. 3B are the top view and cross-section view of the multiple vias in the prior art, respectively.
Figure 3B:
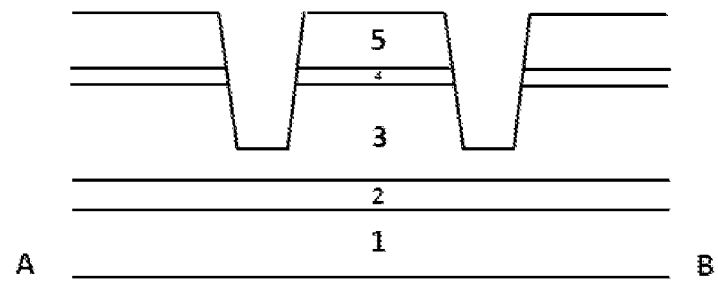

FIG. 3A is the top view of a plurality of vias in the prior art, and FIG. 3B is the sectional view of FIG. 3A cut along the A-B direction.

Figure 4A:
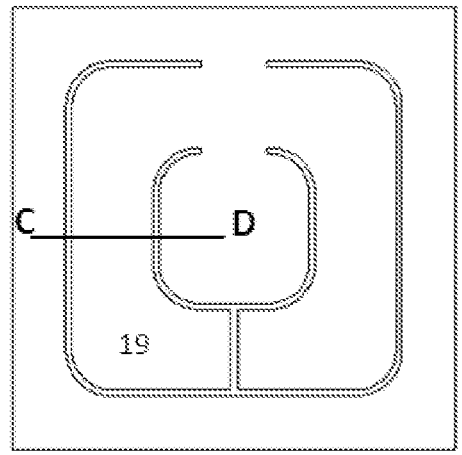
FIG. 4A and FIG. 4B are the top view and cross-section view of linear convex mesa, respectively.
Figure 4B:
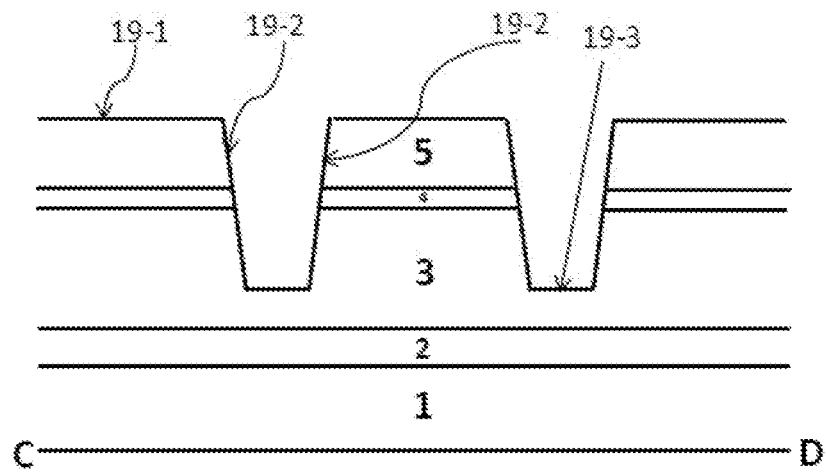

FIG. 4A is the top view of linear convex mesa, and FIG. 4B is the sectional view of FIG. 4A cut along A-B.

The area etched out from convex mesa 19 can be from a single line or multiple lines.

The nitride semiconductor structure with the convex mesa 19 includes the substrate 1, the buffer layer 2, the n-type nitride semiconductor 3, the active layer 4 and the p-type nitride semiconductor layer 5.

The linear convex mesa comprises the first top surface 19-1 and the side surface 19-2 and the second top surface 19-3. An L shape is formed by the side surface 19-2 and the second top surface 19-3 located on the both ends of the first top surface 19-1.

The first top surface 19-1 of the convex mesa is the top surface of the p-type nitride semiconductor layer, and the second top surface 19-3 of the convex mesa is the top surface of the n-type nitride semiconductor layer.

Embodiment 3

Figure 5:
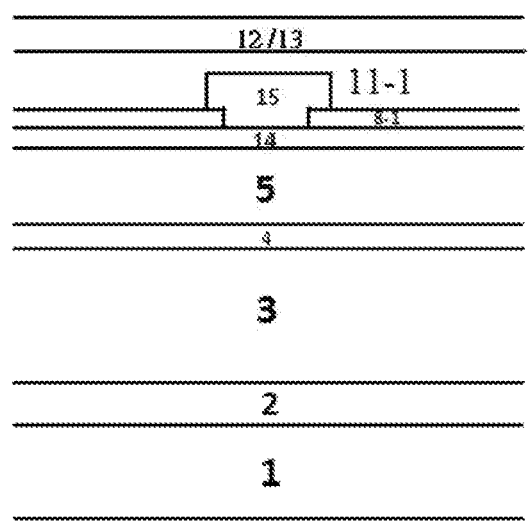
FIG. 5 is the cross-section view of p-type linear electrode.

The bottom end of the p-type linear electrode 15 is located on the surface of the first insulation layer structure 8-1 and the transparent conductive layer 14 (as shown in FIG. 5).

Embodiment 4

Figure 6:
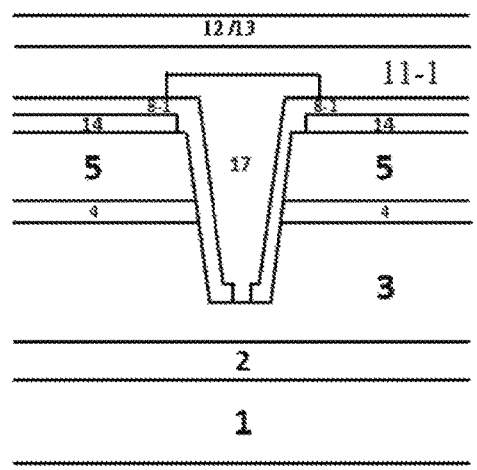
FIG. 6 is the cross-section view of n-type linear electrode.

The groove covering the entire linear convex mesa of the n-type linear electrode 17 is located on the first insulation layer 8-1 and the second surface 19-3 (as shown in FIG. 6).

Embodiment 5

In the fourth step, as shown in FIG. 2D (or FIG. 7), the first insulation layer structure 8-1 is formed by the Bragg reflective layer—metal layer—multilayer insulation layer in this disclosure.

The Bragg reflective layer structure comprises silicon dioxide ($SiO_2$) and titanium dioxide ($TiO_2$), or silicon dioxide ($SiO_2$) and tantalic oxide ($Ta_2O_5$), or silicon dioxide ($SiO_2$) and niobium oxide ($Nb_2O_5$). The thickness of silicon dioxide ($SiO_2$) is in a range of 30-1000 nm, the thickness of the titanium dioxide ($TiO_2$) is in a range of 10-200 nm, the thickness of the tantalic dioxide tantalic oxide ($Ta_2O_5$) is in a range of 10-200 nm, the thickness of the niobium oxide ($Nb_2O_5$) is in a range of 10-200 nm.

Figure 7:
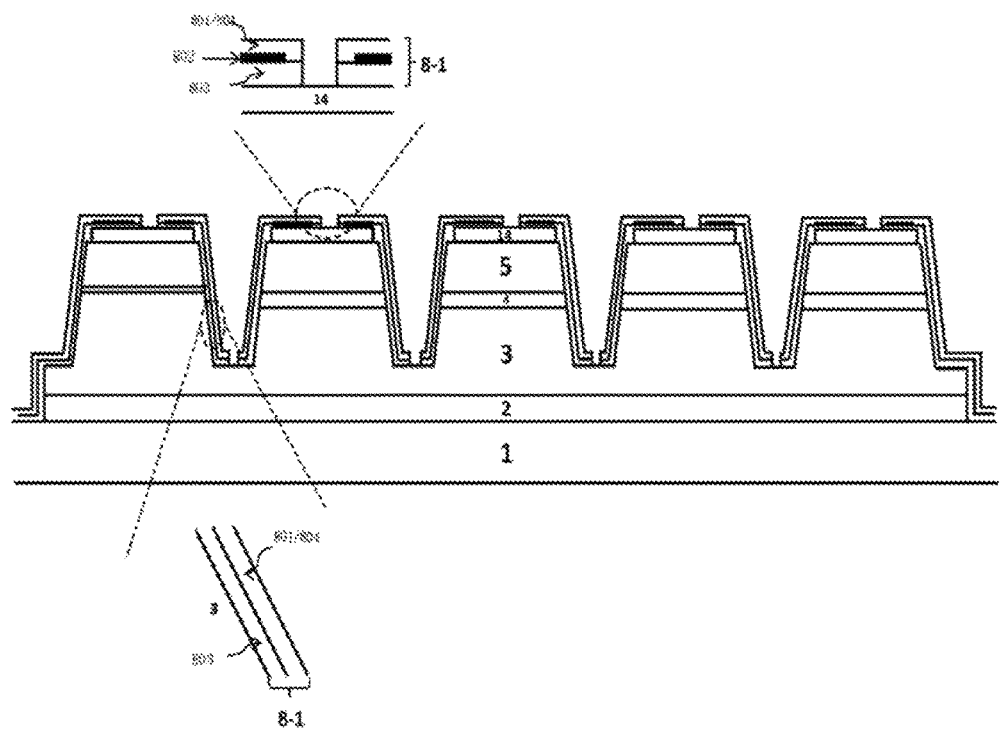
FIG. 7 is another schematic of flip-chip LED chip of which the first insulation layer is formed by Bragg reflective layer, metal layer and multilayer of oxide insulation.

The "metal layer 802" is not included in the first insulation layer 8-1 of the side surface 19-2 in FIG. 7, but it is included in the first insulation layer 8-1 of the side surface 19-2 in FIG. 2D. That is, the side surface 19-2 of the first insulation layer 8-1 can be "the Bragg reflective layer and the oxide insulation layer", but the transparent conductive layer 14 is "the Bragg reflective layer, the metal layer and multilayer of oxide insulation."

In the preferred scheme above, the Bragg reflective layer is silicon dioxide/titanium dioxide/silicon dioxide/titanium dioxide/silicon dioxide, or silicon dioxide/tantalic oxide/silicon dioxide/tantalic oxide/silicon dioxide, or silicon dioxide/niobium oxide/silicon dioxide/niobium oxide/silicon dioxide.

Of the scheme above, the first insulation layer structure 8-1 includes the multilayer of the oxide insulation, the metal layer, and the Bragg reflective layer. The multilayer of the oxide insulation layer of the first insulation layer structure 8-1 is located on the metal layer, and the metal layer is located on the top surface of the Bragg reflective layer of the first insulation layer structure 8-1.

The multilayer of oxide insulation comprises at least one of aluminum oxide ($Al_2O_3$), silicon dioxide ($SiO_2$), titanium dioxide ($TiO_2$), tantalic oxide ($Ta_2O_5$), niobium oxide ($Nb_2O_5$), silicon oxide ($Si_2N_2O$) and silicon nitride ($Si_3N_4$). A thickness of each layer of the multilayer of the oxide insulation is in a range of 30-200 nm.

The material of the multilayer oxide insulation layer comprises at least one of aluminum oxide ($Al_2O_3$), silicon dioxide ($SiO_2$), titanium dioxide ($TiO_2$), tantalic oxide ($Ta_2O_5$), niobium oxide ($Nb_2O_5$), silicon oxide ($Si_2N_2O$) and silicon nitride ($Si_3N_4$), wherein each layer thickness of the multilayer oxide insulation layer is in a range of 30-2000 nm.

The multilayer of oxide insulation above is the combination of silicon dioxide ($SiO_2$) and titanium dioxide ($TiO_2$) wherein each layer thickness is in a range of 30-2000 nm.

Of the scheme above, the first insulation layer structure 8-1 includes the Bragg reflective layer, the metal layer, and the multilayer of the oxide insulation. The method includes the following. The Bragg reflective layer is deposited at first, then a pattern on the metal layer is defined, the metal layer is deposited, the multilayer of oxide insulation is deposited, and then a connection pattern between a p-type contact metal 9 and the transparent conductive layer 14 and a contact pattern between an n-type contact metal 10 and the second top surface of the linear convex mesa 19-3 is defined, and then a connecting pattern between the multilayer of the oxide insulation and the Bragg reflective layer is continuously etched, before obtaining the first insulation layer structure 8-1.

Embodiment 6

In the fifth step of the chip making, referring to the structure diagram shown in FIG. 2E, the method includes: defining a pattern of the p-type contact metal 9 and a pattern of the n-type contact metal 10 by an etching process, wherein the p-type contact metal 9 and the n-type contact metal 10 is deposited in the mean time, before obtaining the p-type contact metal 9 and the n-type contact metal 10.

As shown in FIG. 2E, the p-type contact metal 9 and n-type contact metal 10 is p-type/n-type linear electrode 15 & 17 and p-type/n-type contact metal 21 & 22; the bottom end of p-type linear electrode 15 is located on the surface of the first insulation layer 8-1 and the second top surface 19-3 of the linear convex mesa, the bottom end of the p-type/n-type connection metal 21 & 22 is located on the surface of the first insulation layer 8-1.

Embodiment 7

In the sixth step of the chip making, the second insulation layer 11-1 of this disclosure is a multilayer of oxide insulation.

All the top surface of the first insulation layer 8-1 and the p-type contact metal 9 and the n-type contact metal 10 comprise a second insulation layer 11-1.

The material of the multilayer of oxide insulation includes combinations of aluminum oxide ($Al_2O_3$), silicon dioxide ($SiO_2$), titanium dioxide ($TiO_2$), tantalic oxide ($Ta_2O_5$), niobium oxide ($Nb_2O_5$), silicon oxide ($Si_2N_2O$) and silicon nitride, ($Si_3N_4$).

Each layer thickness of the multilayer of oxide insulation is in a range of 30-2000 nm in prior art.

Material structure of the preferable multilayer of oxide insulation is the combination of silicon dioxide ($SiO_2$) and titanium dioxide ($TiO_2$), the thickness of the titanium dioxide is in a range of 10-300 nm, and the thickness of the silicon dioxide is in a range of 100-1000 nm.

Embodiment 8

Based on the Embodiment 1, Embodiment 2, Embodiment 3, Embodiment 4 and Embodiment 5, the flip-chip light emitting device has a length of 840 micrometers and a width of 410 micrometers. The manufacturing method for a flip-chip light emitting device of group III nitride semiconductor includes the following steps.

The first step, referring to the structure diagram shown in FIG. 2A, includes providing the substrate 1 and growing the buffer layer 2, the n-type nitride semiconductor 3, the active layer 4 and the p-type nitride semiconductor 5 on the substrate 1 sequentially from a bottom to a top to form an epitaxial structure, wherein the top surface of the epitaxial structure is the top surface of the p-type nitride semiconductor layer 5.

The second step, referring to the structure diagram shown in FIG. 2B, includes by way of electron beam evaporation or sputtering, or reactive plasma deposition (RPD), depositing indium tin oxide (ITO) to form the transparent conductive layer 14 on the surface of the p-type nitride semiconductor 5, wherein the ITO thickness is 10-400 nm, then defining a pattern of a linear convex mesa 19 by an etching process, then etching with ICP on the transparent conductive layer 14 and the p-type nitride semiconductor layer 5 and active layer 4, exposing the n-type nitride semiconductor layer 3, and shrinking the transparent conductive layer 14, before obtaining the linear convex mesa 19 whose top surface has a transparent conductive layer 14 (the transparent conductive layer 14 and the linear convex mesa 19 can be done individually); then annealing the wafer on high temperature to make sure a good ohmic contact and high transparence is formed between the transparent conductive layer 14 and the p-type nitride semiconductor layer 5. Annealing method: using fast annealing furnace (RTA) for fast annealing, the temperature is 560 degrees Celsius, the timeslot is 3 minutes.

The third step, referring to the structure diagram shown in FIG. 2C, includes defining the pattern of an isolation groove 20 with an etching process, then etching the n-type nitride semiconductor layer 3 and the buffer layer 2 to expose the substrate 1.

The fourth step, referring to the structure of the first insulation layer 8-1 formed by the Bragg reflective layer, the metal layer and the multilayer of oxide insulation, as shown in the structure diagram in FIG. 2D, includes depositing the Bragg reflective layer with an optical vacuum coating machine, depositing a metal layer and then defining a metal layer pattern, plating the multilayer of oxide insulation with an optical vacuum coating machine, defining the connection pattern between the p-type contact metal and the transparent conductive layer 14, and the connection pattern of n-type contact metal and the second top surface 19-3 of the linear convex mesa using an etching process, and then continuously etching the connecting pattern of the multilayer of oxide insulation and the Bragg reflective layer to obtain the first insulation layer structure.

In this embodiment, the structure of the Bragg reflective layer is $SiO_2/TiO_2/SiO_2/TiO_2/SiO_2/TiO_2/SiO_2$, wherein the thickness of the $SiO_2$ is in a range of 30-1000 nm, and the thickness of the $TiO_2$ is in a range of 10-200 nm.

In this embodiment, the structure of the metal layer comprises aluminum and titanium, the thickness of aluminum is in a range of 50-500 nm, and the thickness of titanium is in a range of 0.3-30 nm.

In this embodiment, the structure of the multilayer of oxide insulation comprises titanium dioxide ($TiO_2$) and silicon dioxide ($SiO_2$), wherein the thickness of each layer is in a range of 30-2000 nm.

The fifth step, referring to the structure diagram shown in FIG. 2E, includes defining the pattern of the p-type contact metal 9 and the n-type contact metal 10 (including P/n-type contact metal 9, 10 and P/N connection metal 21, 22), and depositing the p-type contact metal and the n-type contact metal in the mean time, to obtain the p-type contact metal and n-type contact metal 10.

In this embodiment, the p-type contact metal 9 and the n-type contact metal 10 has the same structure, and both sequentially comprise the first Ni layer, Al layer, Ni layer, the second Au layer and the third Ni layer from an inner to an outer side, wherein the thickness of the first Ni layer is in a range of 0.4-3 nm, the thickness of the Al layer is in a range of 50-300 nm layer, the thickness of the second Ni layer is in a range of 10-300 nm, the thickness of the Au layer is in a range of 10-3000 nm, and the thickness of the third Ni layer in a range of is 0.4-3 nm.

The sixth step, referring to the structure of the second insulation layer 11-1 being a multilayer of oxide insulation, as shown in the structure diagram in FIG. 2F, includes depositing the multilayer of oxide insulation by using an optical vacuum coating machine; the multilayer of oxide insulation is the combination of Titanium dioxide ($TiO_2$) and Silicon dioxide ($SiO_2$), wherein the thickness of Titanium dioxide ($TiO_2$) is in a range of 10-300 nm and the thickness of silicon dioxide ($SiO_2$) is in a range of 10-1000 nm.

The seventh step, referring to the structure diagram shown in FIG. 2G, includes defining the pattern of a flip-chip p-type/n-type electrode 12 & 13, and depositing the flip-chip p-type electrode 12 and n-type electrode 13 with electron beam evaporation in the mean time.

In this embodiment, the flip-chip p-type electrode 12 and flip-chip n-type electrode 13 has the same structure, and both sequentially comprise the first Ti layer, the second Ni layer, the Au layer from an inner to an outer side, or sequentially comprise the first Ni layer, Al layer, the second Ni layer, Au layer, wherein the thickness of the Ti layer is in a range of 10-300 nm, the thickness of the first Ni layer is in a range of 0.4-3 nm, the thickness of the second Ni layer is in a range of 10-300 nm, and the thickness of the Au layer is in a range of 20-3000 nm.

In the eighth step, the wafer is thinned, diced, separated, tested and sorted.

The ninth step includes packing the flip chip package and measuring the photoelectric characteristic.

Figure 8:
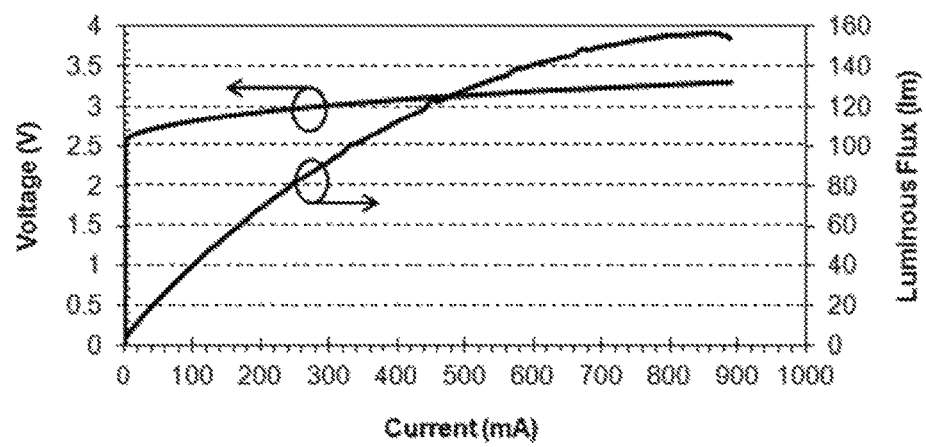
FIG. 8 is the diagram of the luminance and current and voltage characteristics of the flip-chip LED chip.
Figure 9:
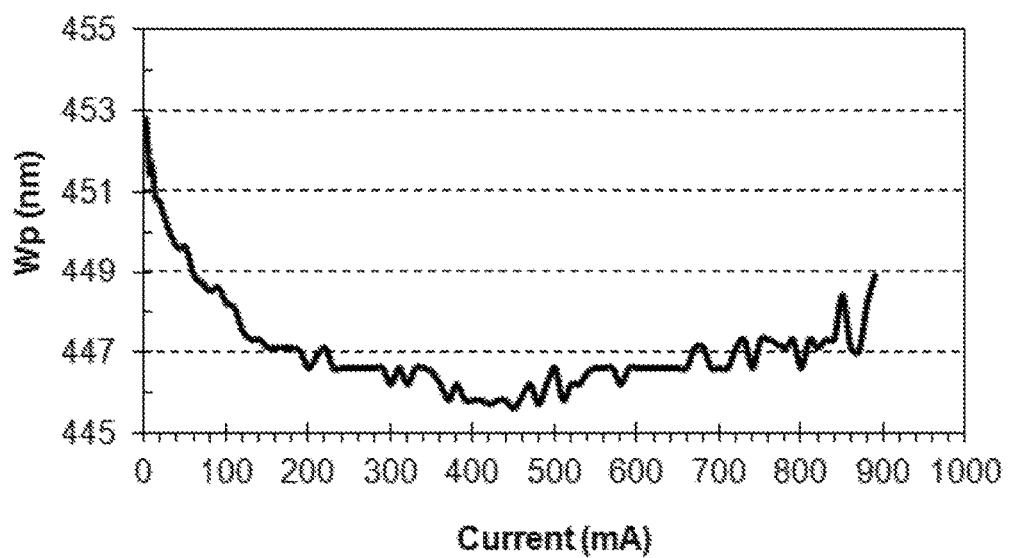
FIG. 9 is the diagram of the current characteristics and the peak wavelength of the flip-chip LED chip.

The characteristics of the test results is shown in FIG. 8 and FIG. 9 for the product made according to method of the embodiment 8.

As shown in FIG. 8 and FIG. 9, the photoelectric properties of the product include: when input current is 150 mA and the voltage is 2.88 V, then the product brightness is 55.3 lm (color 6900 K) and the peak wavelength is 447.1 nm; when input current is 300 mA and the voltage is 3.01 V, then the product brightness is 92.61 lm (color 7174 K) and the peak wavelength is 446.2 nm; when input current is 860 mA and the voltage is 3.29 V, then the product brightness is 157.4 lm (color 7724 K) and the peak wavelength is 447.1 nm. From FIG. 8 and FIG. 9, it is concluded that this product is provided with higher operating current and lower voltage and higher brightness and less wavelength shift, compared with the normal structure product.

Compared with the prior art, the manufacturing method of a flip-chip structure of a group III semiconductor light emitting device has the following advantages:

The method of the disclosure is to replace a plurality of holes (vias) in the prior art by using a linear convex mesa technique.

In this disclosure, the structure of the first insulation layer which is formed by the Bragg reflective layer, the metal layer and the multilayer of oxide insulation, acts as a reflector and an insulation layer to replace the flip-chip reflector and a first insulation layer 8. The metal protective layer 7 can be omitted. No reflector structure is provided on the side wall of the traditional flip-chip linear convex mesa. The side wall of the linear convex mesa in this disclosure is provide with a reflector structure and an isolation groove, and the isolation groove is also provided with a reflector.

In this disclosure, it is acceptable to make the transparent conductive layer and the line convex mesa pattern together on the first step. It is not only to simplify one process, but also to solve the defects of the alignment of the transparent conductive layer and the pattern of the linear convex mesa.

In this disclosure, the first insulation layer is formed by the Bragg reflective layer, the metal layer and the multilayer of oxide insulation, then the p-type contact metal and the n-type contact metal are plated, so that the photoelectric characteristic of the flip-chip can be measured in this step.

The description above is shown and described with several preferred embodiments of the disclosure, but as mentioned before, it should be understood the limitations of the disclosure are not disclosed in this form, it should not be regarded as the embodiment of the exclusion of the other, and can be used for a variety of other combinations, modifications, environments; and can be described in this article for ideas within the scope of change through the teaching or related fields of technology or knowledge. The changes and changes in the field of personnel in this field shall not be separated from the spirit and scope of the disclosure, and shall be within the scope of the protection required by the disclosure.

What is claimed is:

1. A manufacturing method of a flip-chip structure of a group III semiconductor light emitting device, the manufacturing method comprising:

providing a substrate and growing a buffer layer, an n-type nitride semiconductor layer, an active layer and a p-type nitride semiconductor layer on the substrate sequentially from a bottom to a top to form an epitaxial structure, wherein a top surface of the epitaxial structure is a top surface of the p-type nitride semiconductor layer;

depositing a transparent conductive layer on the top surface of the p-type nitride semiconductor layer, defining a pattern of a linear convex mesa, etching the transparent conductive layer, the p-type nitride semiconductor layer and the active layer to expose the n-type nitride semiconductor layer, thereby obtaining the linear convex mesa, wherein the linear convex mesa comprises a first top surface, a side surface and a second top surface, the first top surface and the second top surface individually connects with the side surface to form an L-shaped structure, the first top surface of the linear convex mesa comprising a top surface of the p-type nitride semiconductor layer, the second top surface of the linear convex mesa being a top surface of the n-type nitride semiconductor layer;

defining an isolation groove by etching the n-type nitride semiconductor layer and the buffer layer to expose the substrate;

depositing a first insulation layer structure formed by a Bragg reflective layer, a metal layer and a multilayer of oxide insulation; wherein the Bragg reflective layer is deposited before the metal layer is deposited, then the metal layer is deposited, and then the multilayer of oxide insulation is deposited, a connection pattern between a p-type contact metal and the transparent conductive layer and a contact pattern between an n-type contact metal and the second top surface of the linear convex mesa are defined, and then a connecting pattern between the multilayer of oxide insulation and the Bragg reflective layer are continuously etched to form the first insulation layer structure;

defining a pattern of the p-type contact metal and a pattern of the n-type contact metal, and then depositing the p-type contact metal and the n-type contact metal, wherein, a bottom surface of the p-type contact metal is located on a surface of the transparent conductive layer and a top surface of the first insulation layer structure, and a bottom surface of the n-type contact metal is located on the second top surface of the linear convex mesa and a top surface of the first insulation layer structure;

depositing a second insulation layer structure, wherein a pattern is defined, the pattern is used for accessing the p-type contact metal and the n-type contact metal with an opening, and then an opening pattern of the second insulation layer structure is etched; and defining a pattern of a flip-chip p-type electrode and a flip-chip n-type electrode, and depositing the flip-chip p-type electrode and the flip-chip n-type electrode on the second insulation layer structure.

2. The manufacturing method of claim 1, wherein the first insulation layer structure is located on the first top surface, the side surface, the second top surface, the transparent conductive layer and the isolation groove.

3. The manufacturing method of claim 1, wherein the Bragg reflective layer comprises layers of silicon dioxide and titanium dioxide, comprises layers of silicon dioxide and tantalic oxide, or comprises layer of silicon dioxide and niobium oxide.

4. The manufacturing method of claim 3, wherein the thickness of the silicon dioxide is in a range of 30 nm to 1000 nm, the thickness of the titanium dioxide is in a range of 10 nm to 200 nm, the thickness of the tantalic oxide is in a range of 10 nm to 200 nm, and the thickness of the niobium oxide is in a range of 10 nm to 200 nm.

5. The manufacturing method of claim 3, wherein the Bragg reflective layer is a five layer stack of silicon dioxide/titanium dioxide/silicon dioxide/titanium dioxide/silicon dioxide, or a five layer stack of silicon dioxide/tantalic oxide/silicon dioxide/tantalic oxide/silicon dioxide, or a five layer stack of silicon dioxide/niobium oxide/silicon dioxide/niobium oxide/silicon dioxide.

6. The manufacturing method of claim 1, wherein the first insulation layer structure comprises the multilayer of oxide insulation, the metal layer, and the Bragg reflective layer, wherein the multilayer of oxide insulation of the first insulation layer structure is located on the metal layer, and the metal layer is located on a top surface of the Bragg reflective layer.

7. The manufacturing method of claim 6, wherein the metal layer material comprises at least one of silver, aluminum, silver indium, platinum, nickel and titanium, therein a thickness of the silver, the aluminum, the silver indium and the platinum is respectively in a range of 50 nm to 500 nm, and a thickness of the nickel and the titanium is respectively in a range of 0.3 nm to 30 nm.

8. The manufacturing method of claim 6, wherein the multilayer of oxide insulation is formed by at least two of aluminum oxide, silicon dioxide, titanium dioxide, tantalic oxide, niobium oxide, silicon oxide and silicon nitride, a thickness of each layer of the multilayer of oxide insulation is in a range of 30 nm to 200 nm.

9. The manufacturing method of claim 1, wherein the p-type contact metal comprises a p-type linear electrode and a p-type connection metal; a bottom side of the p-type linear electrode is located on the surface of the first insulation layer structure and the transparent conductive layer; a bottom side of the p-type connection metal is located on the surface of first insulation layer structure; and the n-type contact metal comprises an n-type linear electrode and an n-type connection metal, a bottom side of the n-type linear electrode is located on the first insulation layer structure and the second top surface, a bottom side of the n-type connection metal is located on the surface of the first insulation layer structure.

10. The manufacturing method of claim 1, wherein the structure of the p-type contact metal is a multilayer of metal layer, the structure of the n-type contact metal is a multilayer of metal layer, and both the p-type contact metal and the n-type contact metal sequentially comprise a first Ni layer, an Al layer, a second Ni layer, an Au layer and a third Ni layer, or sequentially comprise a Ti layer, an Al layer, the second Ni layer, an Au layer and the third Ni layer, or sequentially comprise the Ti layer, the Al layer and the third Ni layer, or sequentially comprise the first Ni layer, the Al layer, the second Ni layer, a Pt layer, the Au layer and the third layer Ni from inner to outer, or sequentially comprise an Cr layer, the Pt layer, the Au layer and the third Ni layer, or sequentially comprise the first Ni layer, the Al layer and the third Ni layer, or sequentially comprise an Rh layer, therein, a thickness of the Rh layer is in a range of 50 nm to 3000 nm, a thickness of the first Ni layer is in a range of 0.3 nm to 300 nm, a thickness of the Al layer is in a range of 50 nm to 300 nm, a thickness of the second Ni layer is in a range of 10 nm to 300 nm, a thickness of the Pt layer is in a range of 10 nm to 300 nm, a thickness of the Au layer is in a range of 10 nm to 3000 nm, a thickness of the third Ni layer is in a range of 0.3 nm to 300 nm.

11. The manufacturing method of claim 1, wherein the second insulation layer structure is disposed on the top surface of the first insulation layer structure, the top surface of the p-type contact metal, and the top surface of the n-type contact metal.

12. The manufacturing method of claim 11, wherein the second insulation layer structure is a second multilayer of oxide insulation, the second multilayer of oxide insulation is formed by at least two of aluminum oxide, silicon dioxide, titanium dioxide, tantalic oxide, niobium oxide, silicon oxide and silicon nitride, a thickness of each layer of the second multilayer of oxide insulation is in a range of 30 nm to 2000 nm.

13. The manufacturing method of claim 1, wherein the bottom side of the flip-chip p-type electrode is disposed on the surface of the p-type contact metal and the second insulation layer structure, and the bottom side of the flip-chip n-type electrode is disposed on the surface of the n-type contact metal and the second insulation layer structure.

14. The manufacturing method of claim 13, wherein both the flip-chip p-type electrode and the flip-chip n-type electrodes sequentially comprise a Ti layer and a second Ni layer and an Au layer from inner to outer, or sequentially comprise a middle Cr layer, a Pt layer, an Au layer, a second Ni layer, a Pt layer, a second Ni layer and an AuSn layer from inner to outer, or sequentially comprise a first Ni layer and an Al layer, the second Ni layer and the Au layer from inner to outer, or sequentially comprise the middle Cr layer, the Pt layer and the Au layer from inner to outer, or sequentially comprise the first Ni layer, the Al layer, the middle Cr layer and the second Ni layer and the Au layer from inner to outer, or sequentially comprise the first Ni layer, the Al layer, the second Ni layer, the Pt layer and the Au layer from inner to outer, therein a thickness of the first Ni layer is in a range of 0.4 nm to 3 nm, a thickness of the second Ni layer is in a range of 10 nm to 300 nm, a thickness of the Ti layer is in a range of 10 nm to 300 nm, a thickness of the Al layer is in a range of 50 nm to 300 nm, a thickness of the Au layer is in a range of 20 nm to 3000 nm, a thickness of the middle Cr layer is in a range of 10 nm to 300 nm, a thickness of the Pt layer is in a range of 10 nm to 300 nm, and a thickness of the AuSn layer is in a range of 1000 nm to 5000 nm.

* * * * *